United States Patent [19]

Sasaki et al.

[11] Patent Number: 5,122,996
[45] Date of Patent: Jun. 16, 1992

[54] REAL-TIME, UNINTERRUPTED TIME-INTERVAL TO VOLTAGE CONVERTER

[75] Inventors: Stanley K. Sasaki, Vancouver, Wash.; Clark P. Foley, Portland, Oreg.; Michael A. Gauland, Vancouver, Wash.

[73] Assignee: Tektronix, Inc., Beaverton, Oreg.

[21] Appl. No.: 564,512

[22] Filed: Aug. 9, 1990

[51] Int. Cl.⁵ .......................... G04F 8/00; G04F 10/00
[52] U.S. Cl. ..................................... 368/113; 368/115; 368/121; 324/121 R
[58] Field of Search .................. 368/113-121; 364/569; 324/78 R, 78 D, 77 A, 121 R; 377/20

[56] References Cited

U.S. PATENT DOCUMENTS

| | | | |
|---|---|---|---|
| 4,362,394 | 12/1982 | Menlove | 368/118 |
| 4,678,345 | 7/1987 | Agoston | 368/119 |
| 4,704,036 | 11/1987 | Holte et al. | 368/120 |
| 4,855,968 | 8/1989 | Shank | 368/115 |
| 4,985,844 | 1/1991 | Ioley et al. | 364/487 |

OTHER PUBLICATIONS

"System Timer/Counters", *Fluke/Philips* 1988 Catalog, advertisement for Analog Recorder Output PM 9695, p. 320.
"TIAs: A New Way to Measure Time", *Electronic Engineering Times*, Jun. 4, 1990, p. 54.
*Tektronix* 067-0587-02 *Calibration Fixture Signal Standardizer Service Instruction Manual*, 1979, pp. 5-9.
*Tektronix* 067-0587-10 7612D *Calibration Fixture Signal Standardizer Service Instruction Manual*, 1986, pp. 1-3.

Primary Examiner—Vit W. Miska
Attorney, Agent, or Firm—Boulden C. Griffith

[57] ABSTRACT

A method and apparatus performs time-interval to voltage conversion immediately and continuously allowing timing variations to be viewed and correlated with other voltage signals displayed on an oscilloscope. A calibration output assists in calibrating the vertical gain and offset of the oscilloscope. An automatic setup software routine finds suitable resolution and offset settings. The method includes the steps of selecting the type of time-interval to be measured, scaling the counting of a clock signal appropriately, offsetting the counting means as desired, counting the number of clock signals that occur during every selected time-interval, limiting the counted results to a preselected range, and converting the counted results to an analog voltage for display by an oscilloscope. And, in a preferred version of the method, when counted results are limited the operator is notified, and there is an additional step of detecting when time-intervals are occurring faster than they can be counted and notifying the operator of that too. A corresponding apparatus for performing the method is disclosed.

28 Claims, 13 Drawing Sheets

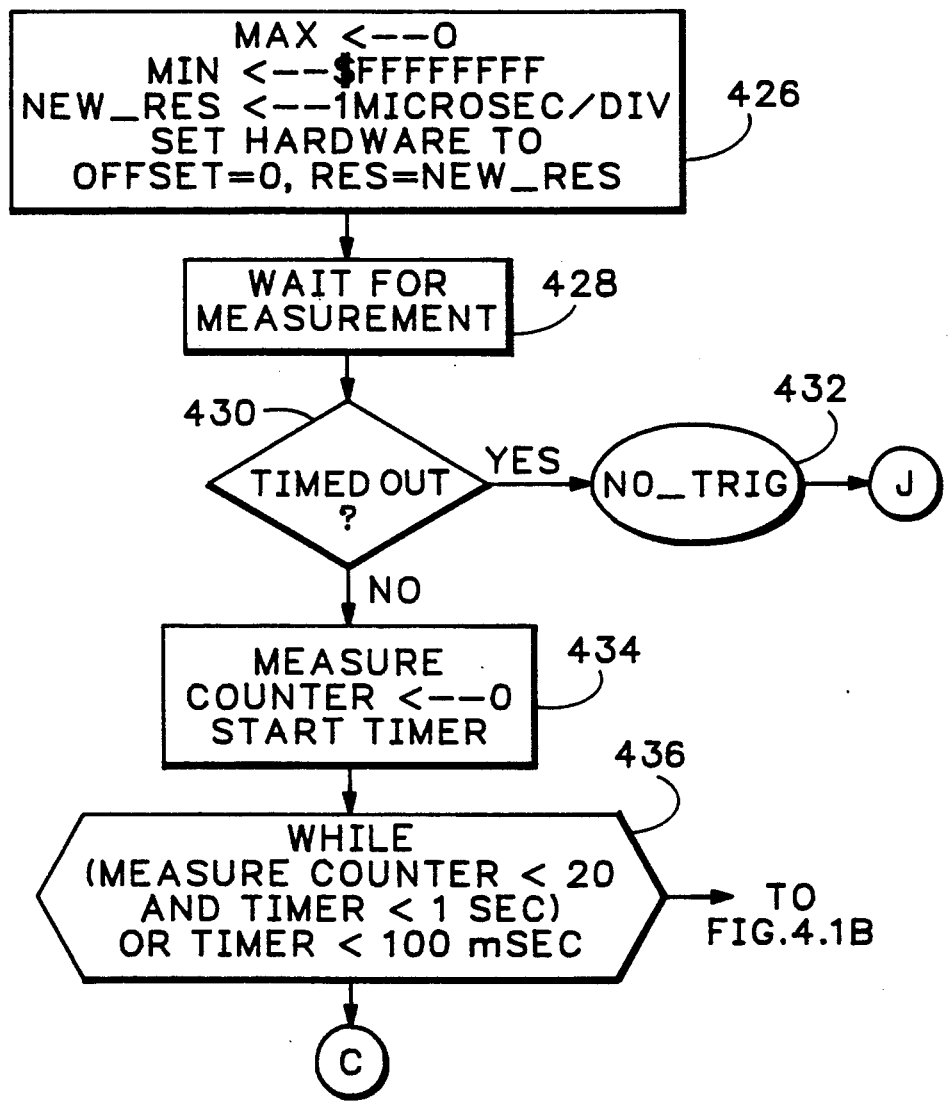
FIG.4.1A

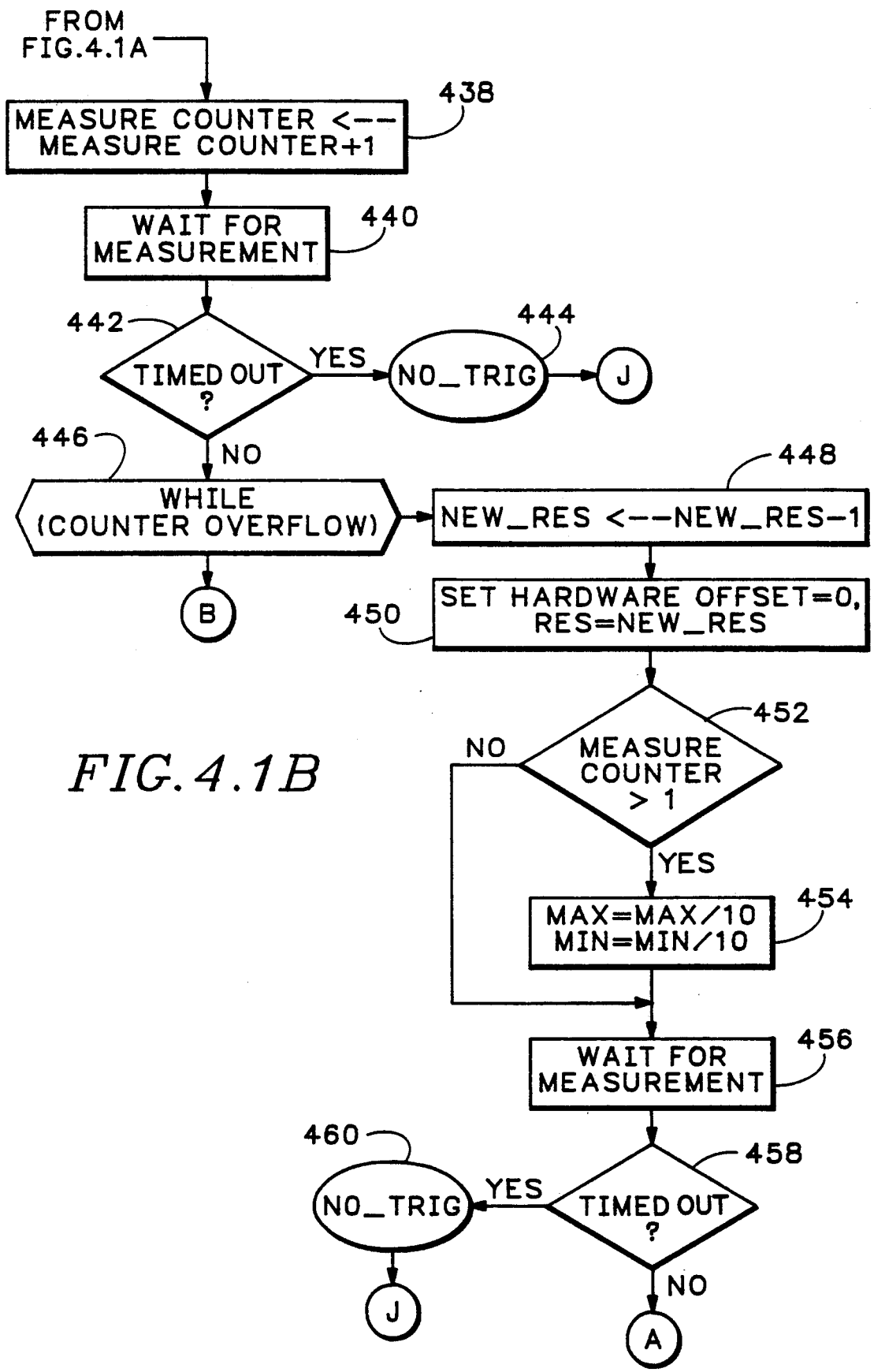
FIG.4.1B

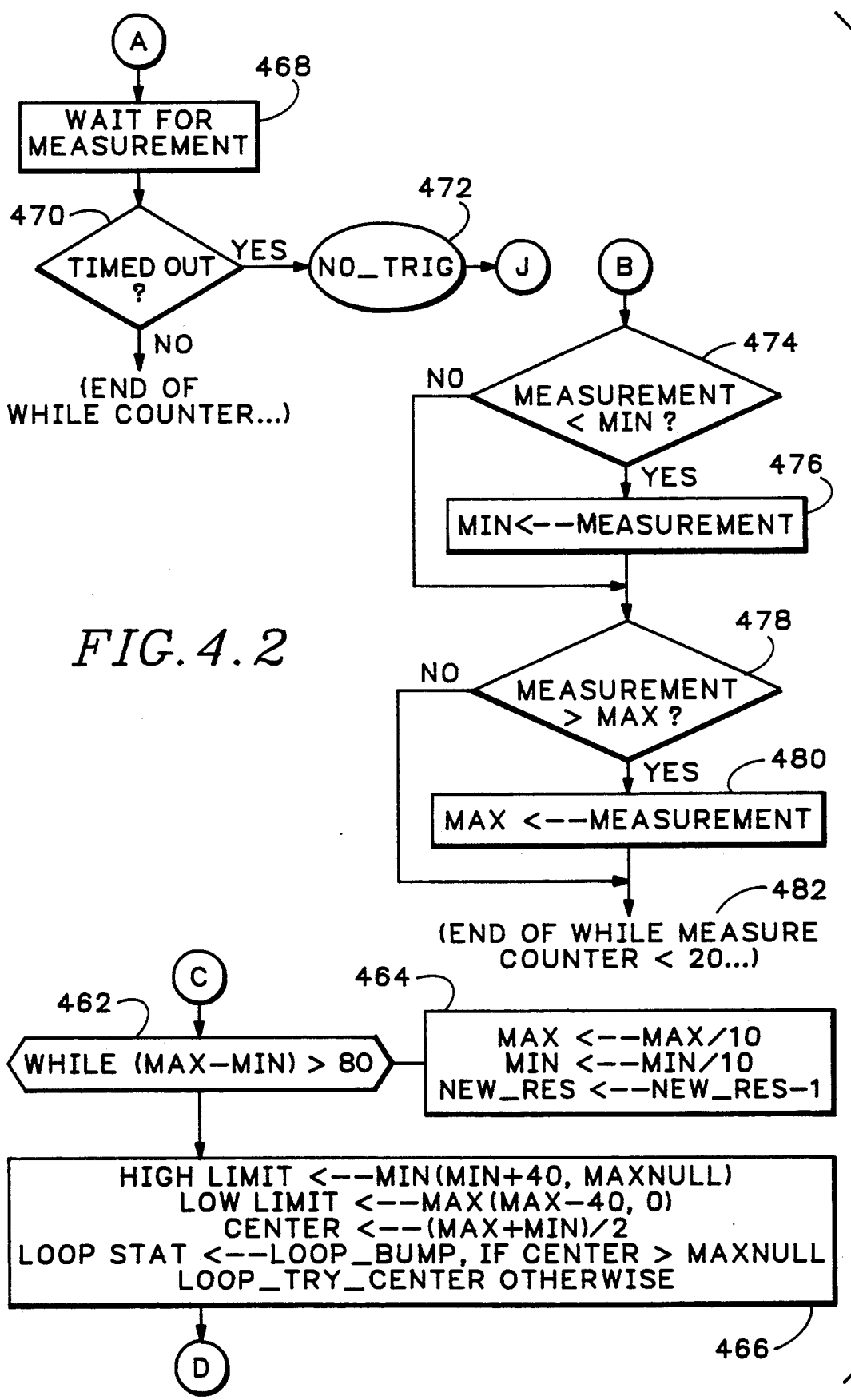
FIG. 4.2

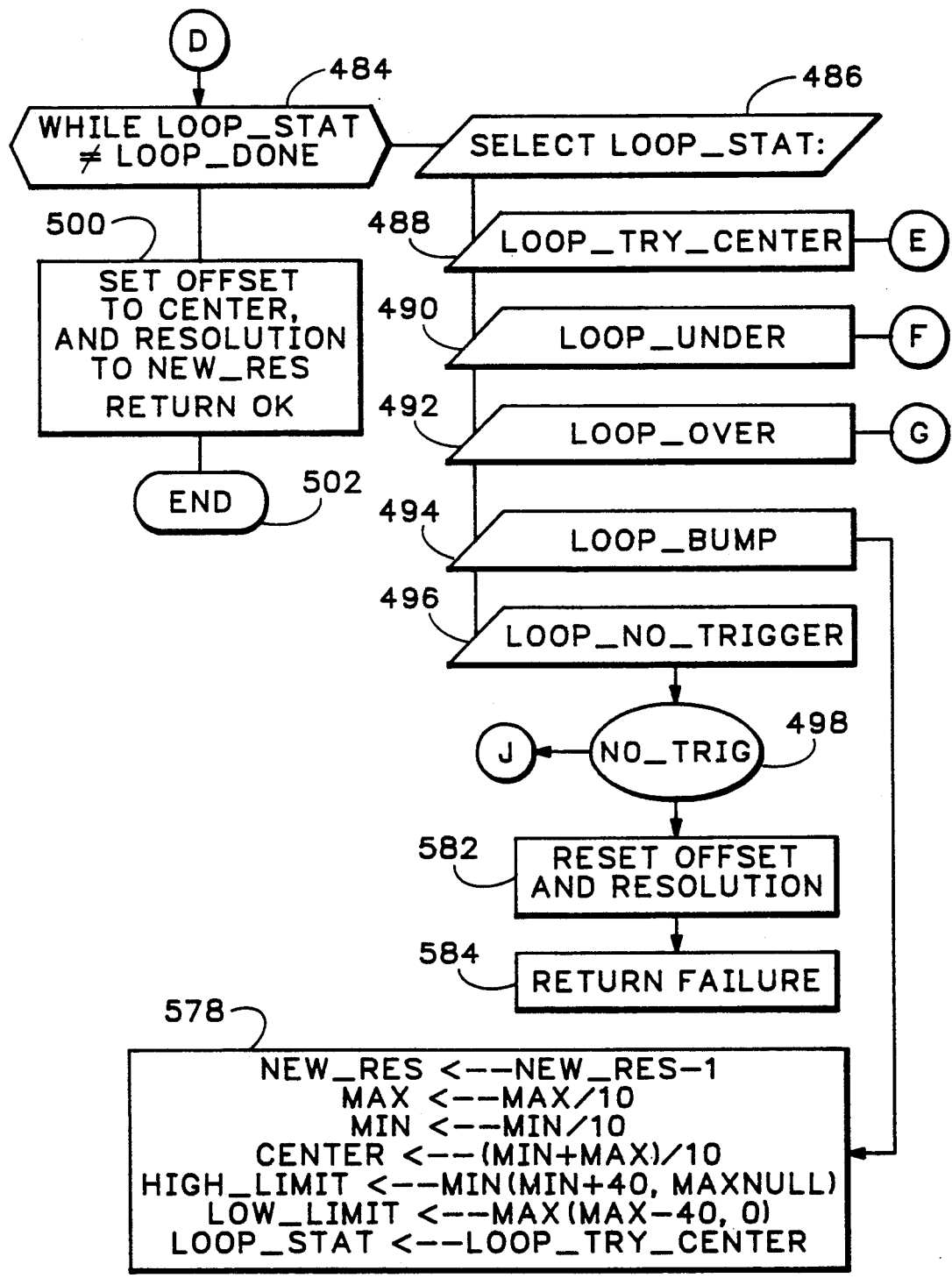
FIG.4.3

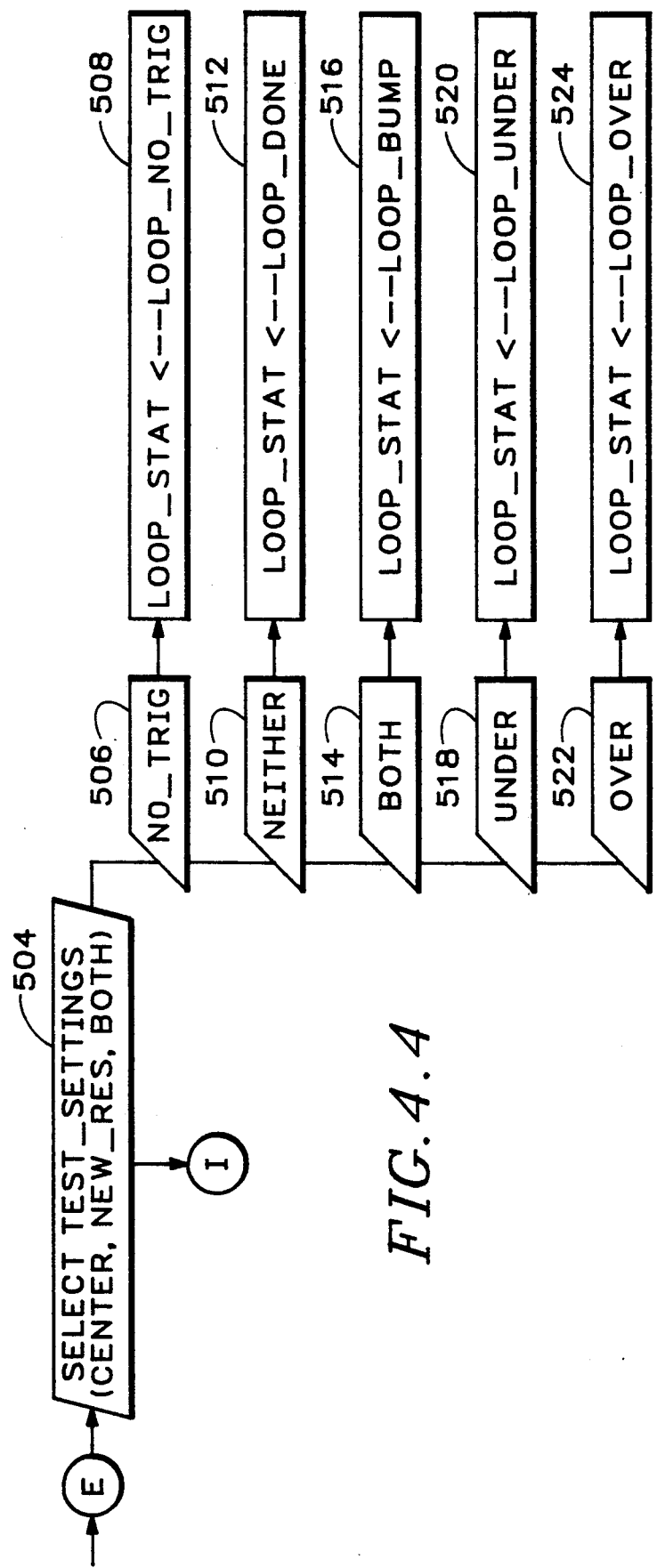
FIG. 4.4

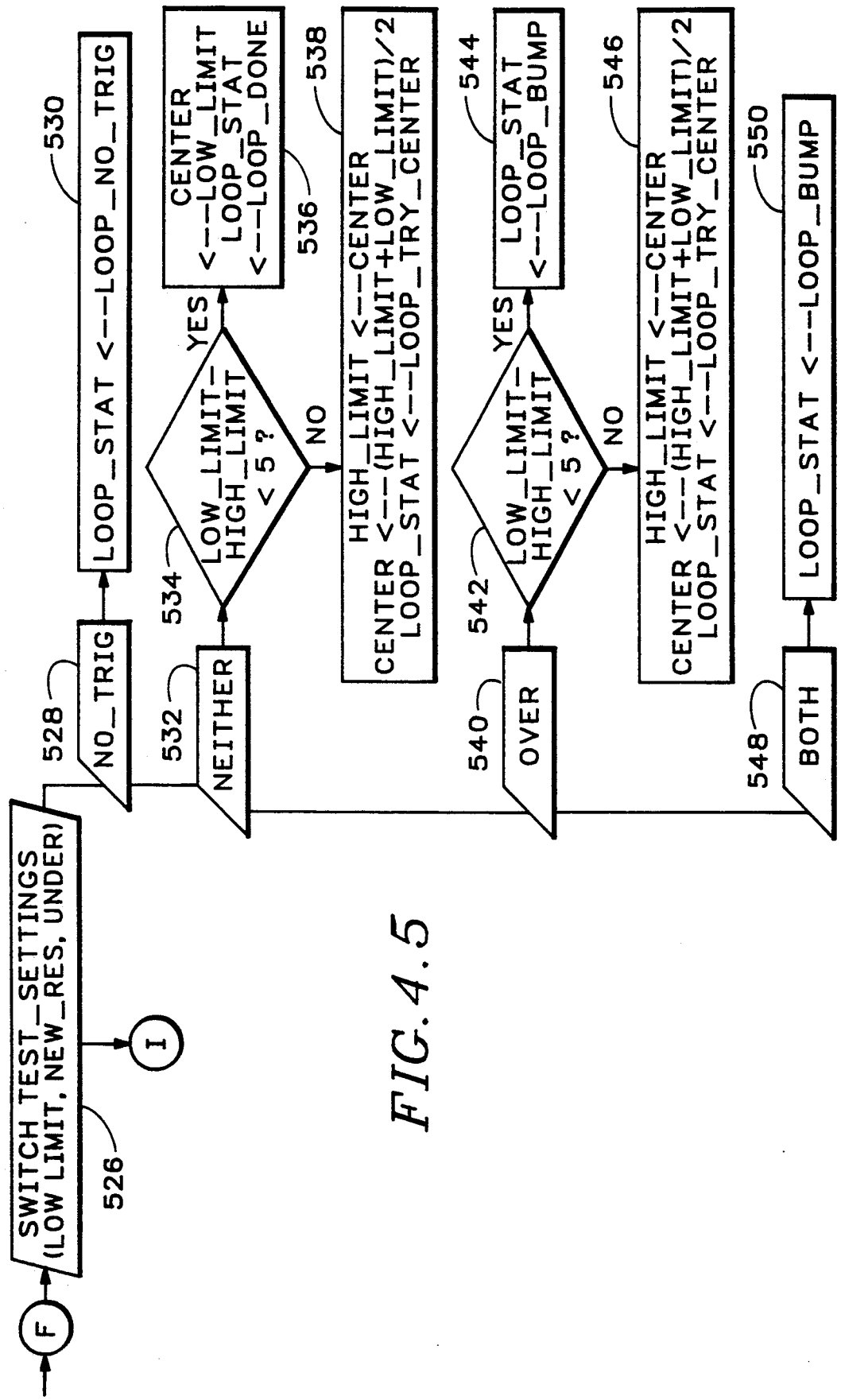
FIG.4.5

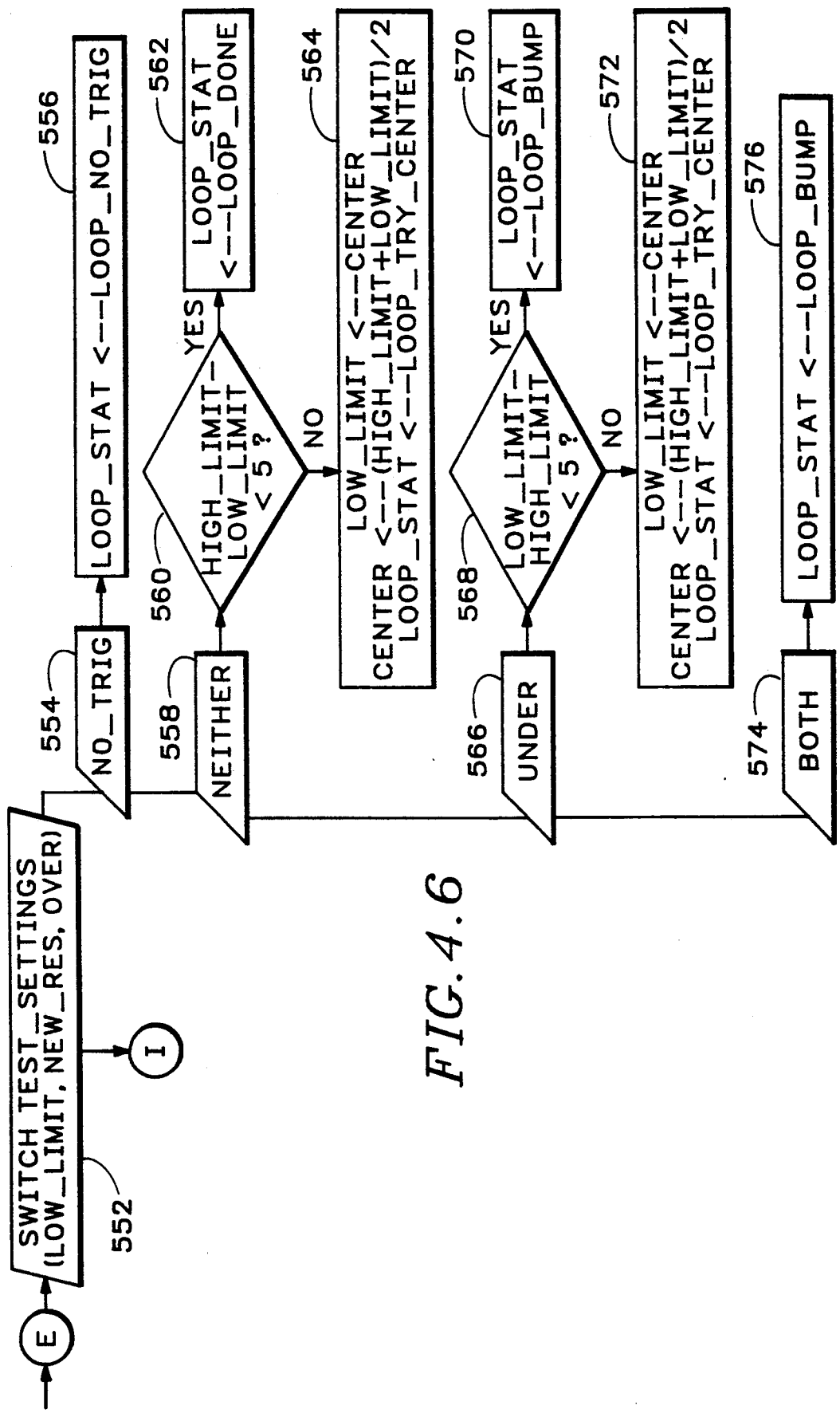
FIG. 4.6

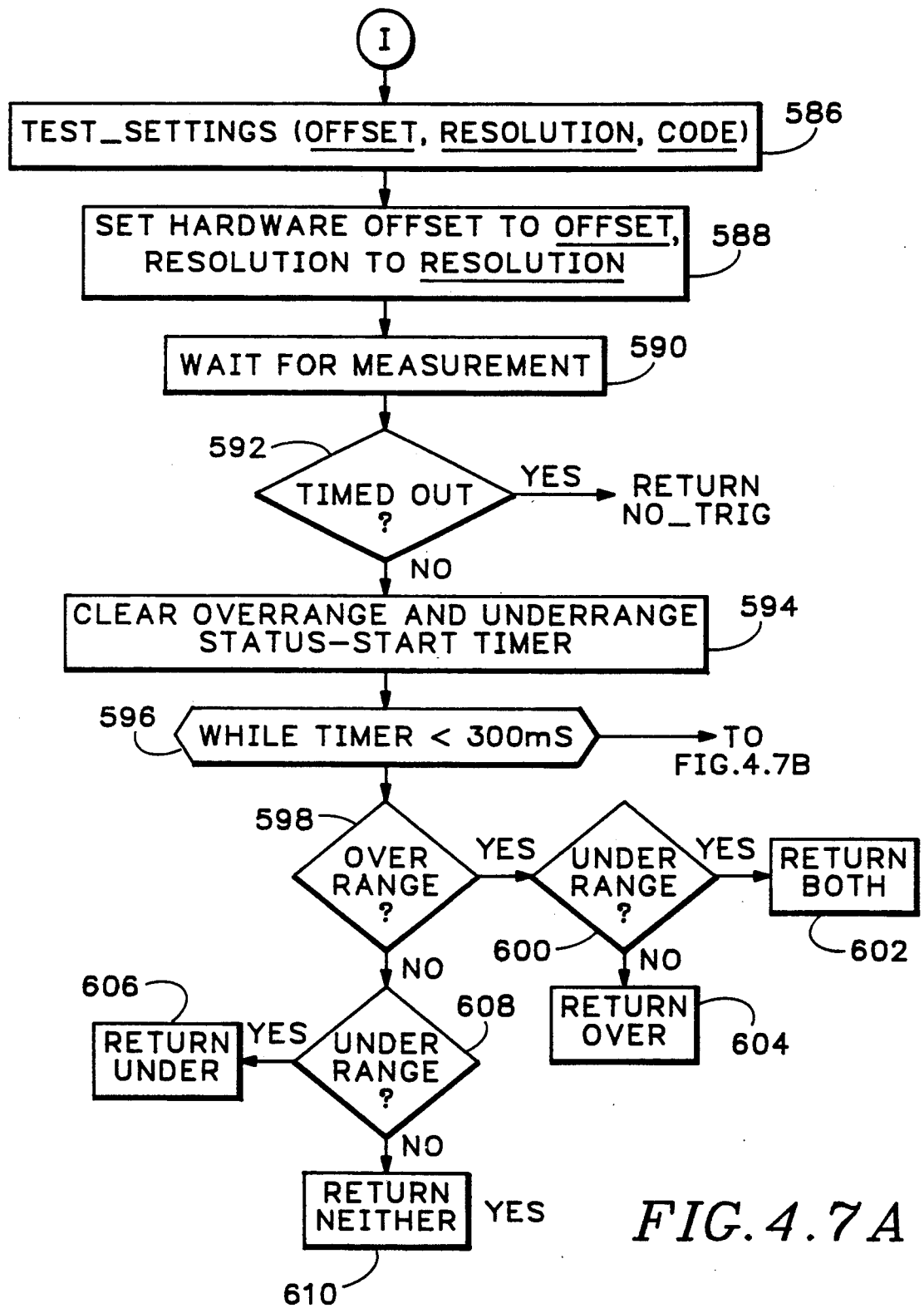
FIG. 4.7A

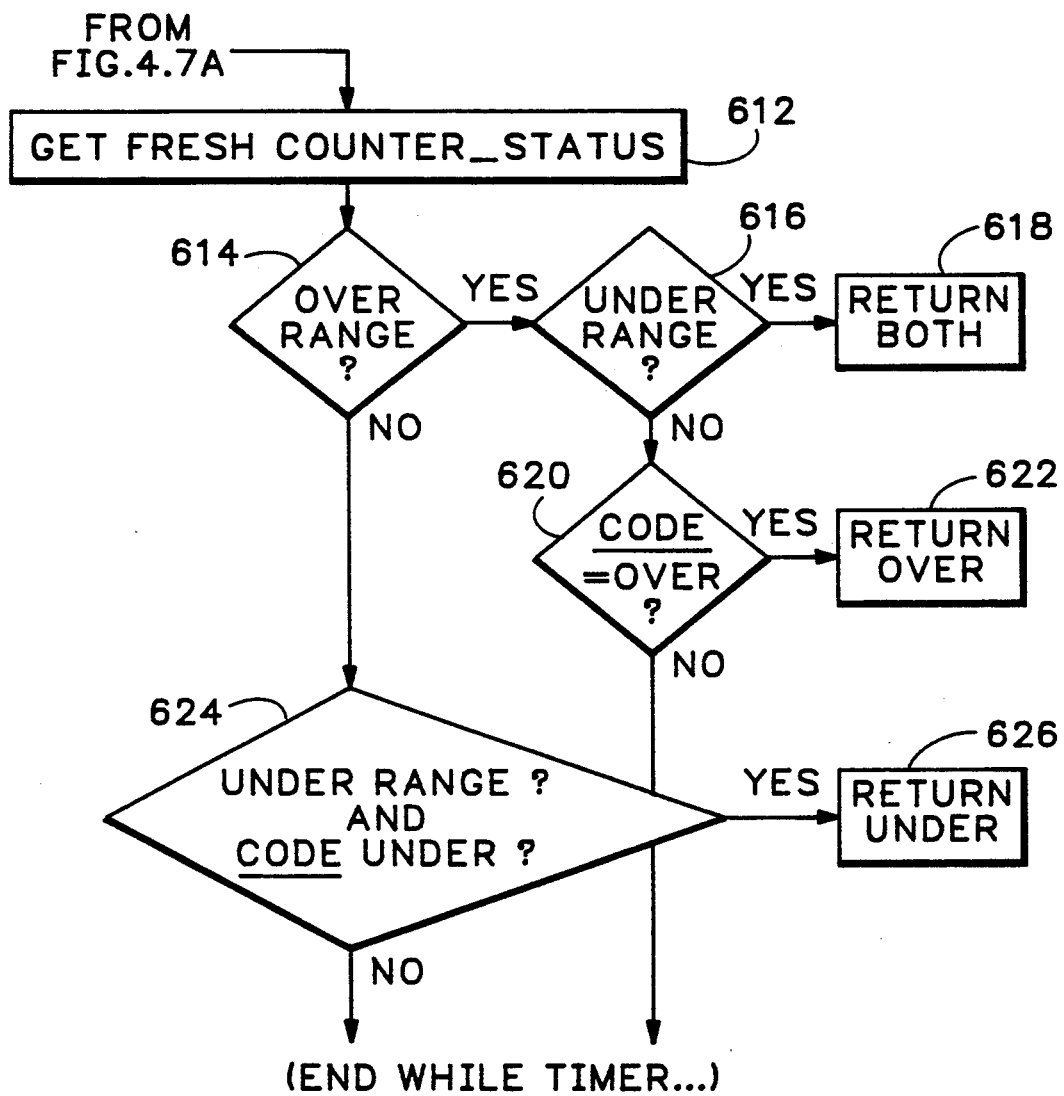
FIG.4.7B

REAL-TIME, UNINTERRUPTED TIME-INTERVAL TO VOLTAGE CONVERTER

BACKGROUND OF THE INVENTION

This invention relates to the field of time-interval measurement, and more particularly to the field of displaying time-interval measurement results as a voltage on an oscilloscope as they occur and without interruption.

In the design, debugging, maintenance or repair of electronic circuits, it is frequently desirable to be able to measure time-intervals. From monitoring pulse code modulation behavior to time base stability measurements to analyzing various sorts of time varying behaviors of signals, the need to effectively analyze the time-intervals of electronic signals, especially digital signals, is a major, long felt need in the electronics industry. Until now, effective tools for this type of measurement have been limited, complicated, expensive or difficult to use.

Attempting to make these measurements with a conventional oscilloscope meets with limited success, especially for signals whose time varying behavior interferes with the triggering process. Digital storage oscilloscopes do allow for after-the-fact analysis of stored records by either an operator or post-processing software. But record length is limited, real-time analysis is impossible, and so is continuous analysis beyond the record length. Similarly, high speed logic analyzers can acquire, store and analyze later information about the timing behavior of digital signals, but with the same type of limitations.

Another approach has been emerging in recent years. Variously called time-interval analyzers, modulation domain analyzers, or digital timing analyzers, these instruments analyze time-interval information and display the results as a graph of frequency versus time, time-interval versus time, or time-interval versus number of occurrences.

Some of these instruments rely on sampling techniques and statistical analysis, and therefore the analysis they provide is not based on a complete, continuous record. Other instruments monitor every occurrence, but do not keep track of the sequence of events. That is, they measure every interval and keep track of how many times intervals of different lengths occur, but not the order in which they occur. A time-interval versus number-of-occurrences type of display only is provided, since time information has been lost in the process.

Until now, the instruments that made continuous measurements so that their output is based on a complete record, relied on post-processing to accomplish their analysis, and so their record length is always ultimately limited by memory size.

What is desired is a method and apparatus that performs time-interval to voltage conversion immediately and continuously, allowing timing variations to be viewed and correlated with other voltage signals displayed on an oscilloscope, and that preferably include means for producing a calibration output suitable for calibrating the vertical gain and offset of the oscilloscope, and that also preferably have means for automatically finding suitable resolution and offset settings that are appropriate to the signal and measurement being made.

SUMMARY OF THE INVENTION

Accordingly, the present invention relates to a method and apparatus that performs time-interval to voltage conversion immediately and continuously, allowing timing variations to be viewed and correlated with other voltage signals displayed on an oscilloscope, and that preferably include means for producing a calibration output suitable for calibrating the vertical gain and offset of the oscilloscope, and that also preferably have means for automatically finding suitable resolution and offset settings that are appropriate to the signal and measurement being made.

The method includes the steps of selecting the type of time-interval to be measured, scaling the counting of a clock signal appropriately, offsetting the counting means as desired, counting the number of clock signals that occur during every selected time-interval, limiting the counted results to a preselected range, and converting the counted results to an analog voltage for display by an oscilloscope. And, in a preferred version of the method, when counted results are limited, the operator is notified, and there is an additional step of detecting when time-intervals are occurring faster than they can be counted and notifying the operator.

Correspondingly, the apparatus includes means for selecting the type of time interval to be measured, means for scaling the counting of a clock signal appropriately, means for offsetting the counting means as desired, means for counting the number of clock signals that occur during every selected time-interval, means for limiting the counted results to a preselected range, and means for converting the counted results to an analog voltage for display by an oscilloscope. And, in a preferred embodiment, there are means for notifying the operator when counted results are limited, as well as means for detecting when time-intervals are occurring faster than they can be counted and notifying the operator of that too.

The means for generating a calibration signal repeatedly produces nine equally spaced-apart voltages levels in a sequence, with the duration of the fifth, central level being eight times longer than the duration of the other levels.

The means for automatically finding suitable resolution and offset settings is a software routine that tries different settings, while monitoring overflow indications and maximum and minimum intervals in the data that it gathers, so that it finds settings for resolution and offset that are appropriate to the signal and measurement being made.

DETAILED DESCRIPTION

Figure 1:
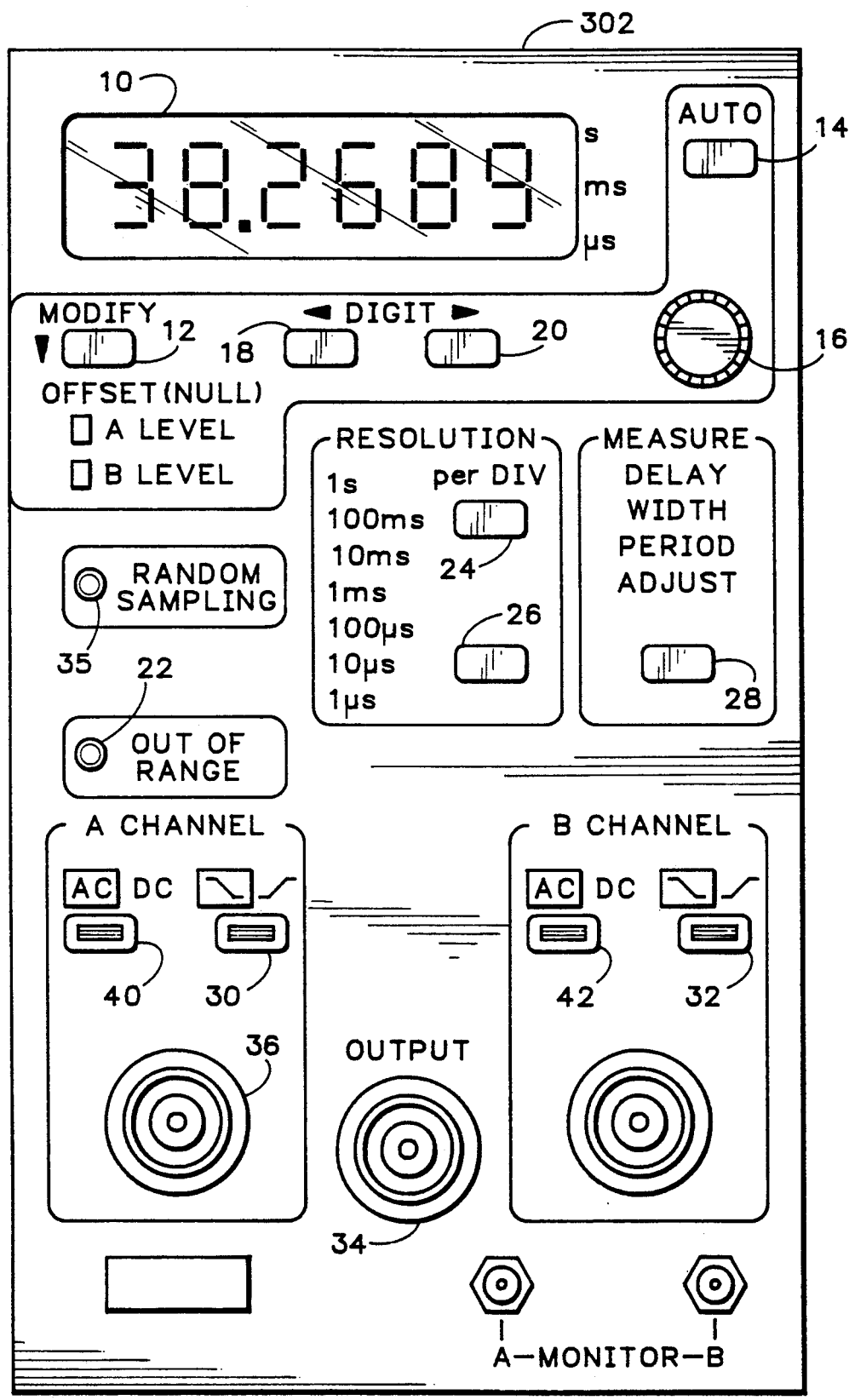
FIG. 1 is front panel view of the time-interval to voltage converter of the present invention.

Referring to FIG. 1, display area 10 at the top of front panel 302 of the time-interval to voltage converter of the present invention displays either offset or trigger settings, selectable by pressing the Modify key 12. Pressing the Modify key 12 repeatedly causes cycling through the choices of Offset Timing, A Level, and B Level.

When offset values are displayed, one of the three indicators to the right of the display area 10 is illuminated. The offset can range from microseconds to seconds, so the three indicators to the right of the display area 10 are "s" for seconds, "ms" for milliseconds, and "us" (actually mu-s) for microseconds. When trigger levels for the two channels, A Channel and B Channel, are being displayed, none of these time indicators are illuminated and an "a" or a "b" is displayed in the most significant digit of the display area 10. A signed (+/−) voltage value is then displayed in the four least significant digits of the display area 10.

Settings displayed in the display area 10 can be adjusted by pressing the Auto key 14 or by using the knob 16 in conjunction with Digit selection keys 18 and 20. The knob 16 changes the value of one of the digits in the display area 10. Which digit of the display area 10 is being controlled by the action of the knob 16 can be selected by pressing left Digit selection key 18 or right Digit selection key 20 one or more times. Pressing the left Digit selection key 18 moves the selected digit one to the left, to a more significant digit, while pressing the right Digit selection key 20 moves the selected digit one to the right, to a less significant digit.

Pressing the Auto key 14 while the display area is displaying offset information invokes a software routine that sets the offset and resolution of the time-interval to voltage converter so that the output signal is magnified the maximum possible amount without going outside of the "window" defined by the offset and resolution settings. Stated another way, this software routine controls the offset and resolution controls, while monitoring the signals going to the Out-Of-Range indicator 22, to place the "window" defined by those controls as tightly as possible around the timing variability of the signal(s) being monitored with respect to the measurement type presently selected.

The resolution can be adjusted by the operator directly using the Resolution per Div controls 24,26. The upper Resolution per Div key 24 selects a larger time per division value (lower resolution), while the lower one 26 selects a smaller time per division value (greater resolution). The value selected illuminates one of the values listed to the left of the Resolution per Div keys 24,26. The available selections are 1 s, 100 ms, 10 ms, 1 ms, 100 us, 10 us, or 1 us per division.

The Measure selection key 28 allows the operator to cycle through the choices of Delay, Width, Period and Adjust. The Delay Measure selection permits measurement between rising or falling edges of one signal and the rising or falling edge of another signal. Width Measure selection causes measurement between the rising edge of a signal and the falling edge of the same signal. Period Measure selection causes measurement between a rising edge and the next rising edge of the same signal or between a falling edge and the next falling edge of the same signal. The edge that these measurements are referenced to is determined by channel A and channel B edge selection keys 30 and 32, respectively.

Adjust as a Measure choice causes a calibration signal to be produced on the Output 34. The instrument enters this mode automatically when power is applied, as well as when the operator explicitly selects it by using the Measure selection key 28. The calibration signal facilitates calibration of the gain and offset of an oscilloscope's vertical deflection circuit with the time-interval to voltage converter's digital-to-analog converter output, so that one division on the conventional oscilloscope display is exactly one division as produced by the time-interval to voltage converter.

Figure 2:
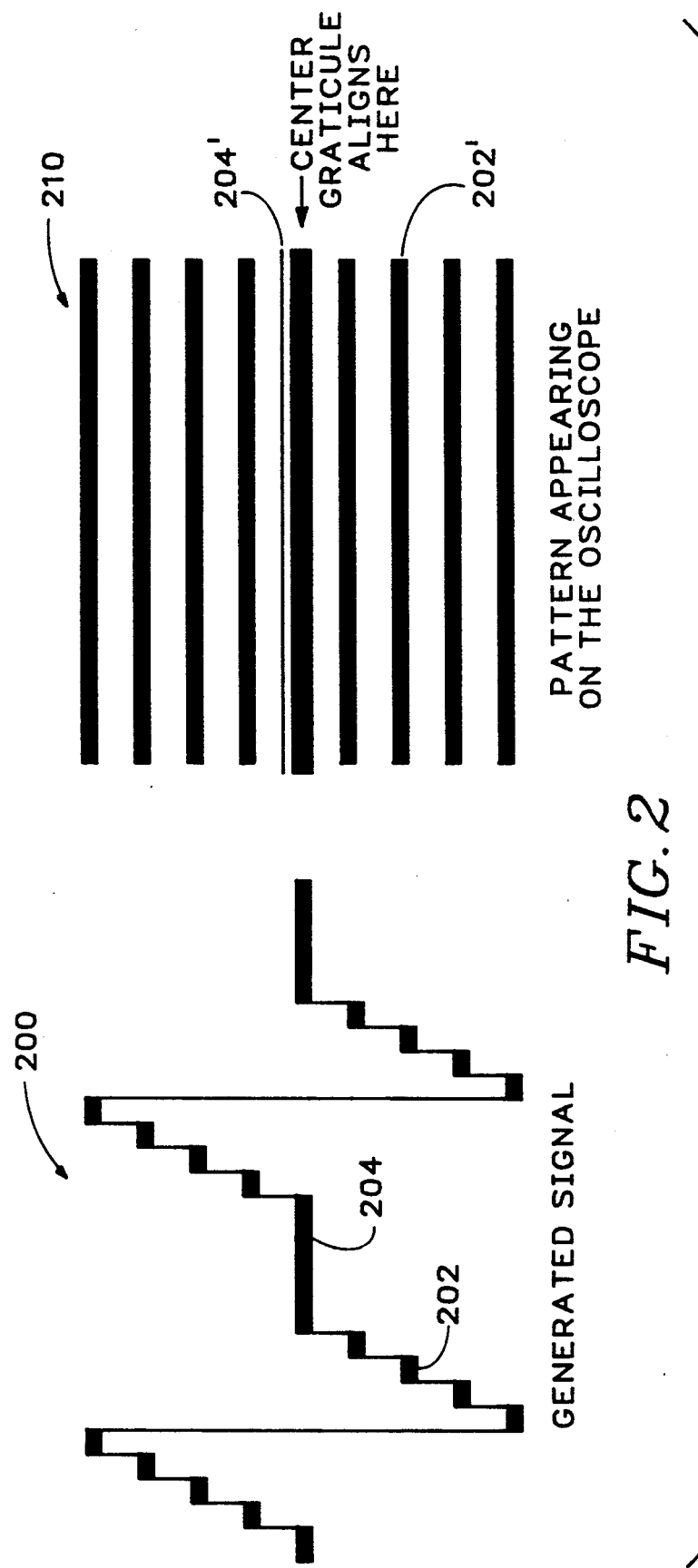
FIG. 2 is ,the calibration output of the time-interval to voltage converter of the present invention.

Referring to FIG. 2, the Adjust choice of Measure produces the calibration signal 200 via instructions from the microprocessor to control a DAC output. The signal is a nine step staircase with the central step 204 eight times as long as the other eight steps 202. When this signal is applied to the input of an oscilloscope and the oscilloscope is permitted to free-run, rather than triggering, the calibration signal 210 appears as nine bars across the oscilloscope display, with the central one 204' intensified relative to the others 202'.

To calibrate the vertical deflection circuit of the oscilloscope, the more intense center line 204' in this pattern is aligned with the center horizontal graticule of the conventional oscilloscope display using the vertical deflection offset control, and the less intense lines 202', produced by the shorter stair steps 202, are aligned with rest of the horizontal graticule lines using the vertical deflection gain control. These adjustments are repeated until each horizontal line of the calibration signal 210 is exactly aligned with the corresponding graticule line of the oscilloscope display.

It should be noted that the less intense lines 202' could be produced by any signals 202 at the proper voltage levels that persist for a relatively short time compared to the more intense level 204'. The stair steps 202 of signal 200 are an arbitrary sequence of the required voltages that could be rearranged to produce the same result. The levels 202 could occur in any order and do not have to be "stairs" at all. What is important in producing the proper free-running display 210 is that the center calibrated voltage level 204 persists for a much longer time than the other voltage levels 202, so that the human eye can readily recognize the intensity difference. Experience has indicated that the central voltage level 204 should persist for eight to ten times longer than the other voltage levels 202 to ensure that the eye will readily distinguish the difference.

Referring again to FIG. 1, each input channel, Channel A and Channel B, is provided with a BNC connector 36,38 to receive the signal, a AC/DC coupling switch 40,42, and an active edge selection switch 30,32. Indicators on the switches suitably illuminate to indicate whether ac or dc coupling has been selected and which edge has been selected as the active edge.

As will be further discussed below, Random Sampling indicator 35 illuminates when incoming signals are occurring at a rate that is faster than the time-interval to voltage converter can measure them all. When the Random Sampling indicator 35 is illuminated, incoming signals are occurring too fast for every occurrence to be measured, but those occurrences that are measured, are measured accurately.

Figure 3:
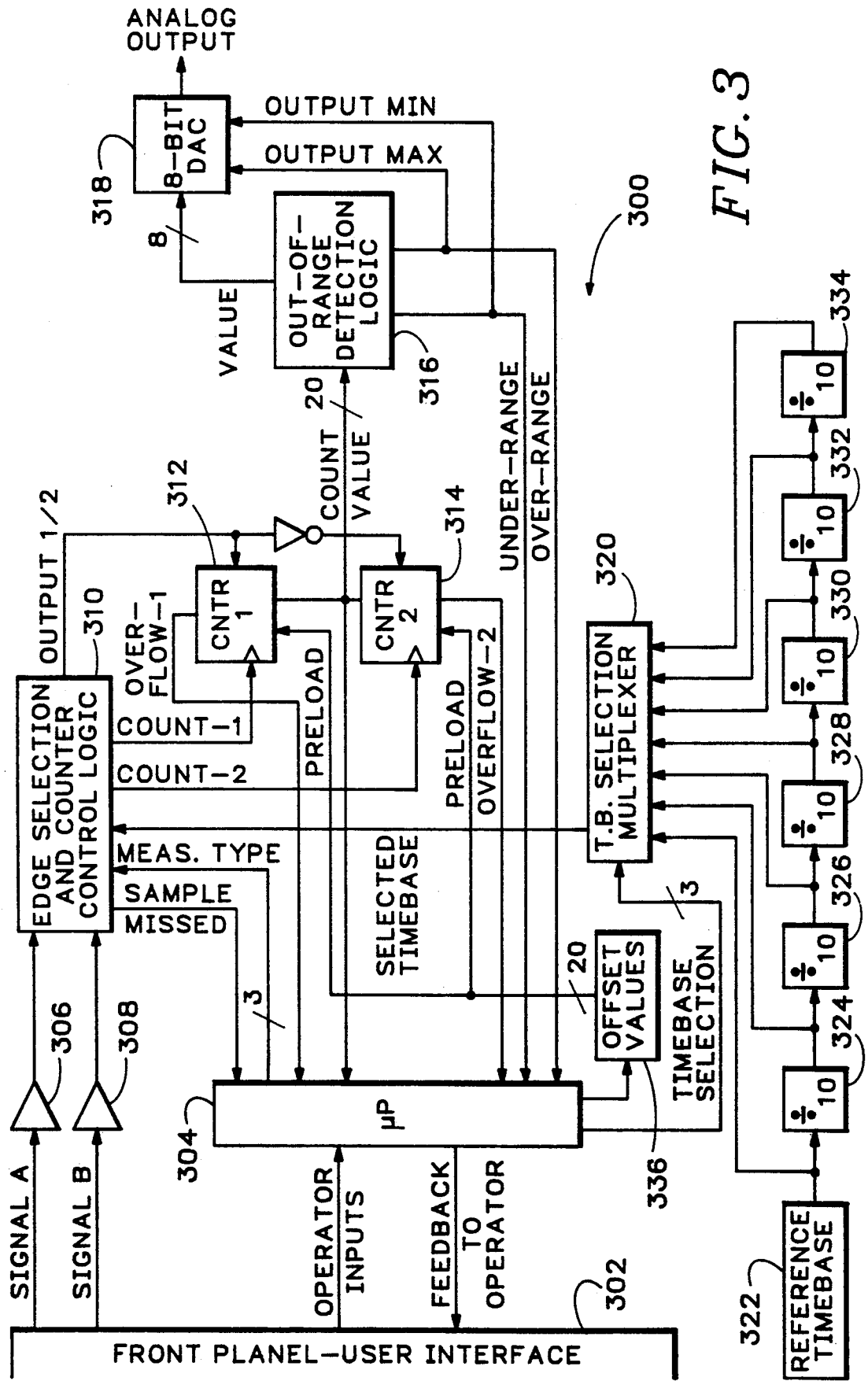
FIG. 3 is block diagram of the time-interval to voltage converter of the present invention, FIGS 4.1A, 4.1B, 4.2, 4.3, 4.4, 4.5, 4.6, 4.7A and 4.7A are a logic flow diagram of the software routine invoked by the Auto key.

Referring now to FIG. 3, the time-interval to voltage converter 300 of the present invention is shown in block diagram form. The front panel or user interface 302 has been described above in reference to FIG. 1. Operator inputs to the front panel 302 are received by a microprocessor 304. The microprocessor 304 also sends feedback to the operator in the form of status and warning messages, such as "Out of Range" or "Random Sampling". The signals being monitored from Channel A and Channel B, signal A and signal B, are amplified by amplifiers 306 and 308 and presented to the edge selection and counter control logic 310.

Edge selection and counter control logic 310 receives instructions from the microprocessor 304 informing it about the type of measurement that the operator has selected. Based on these instructions, the edge selection and counter control logic 310, by means of conventionally configured logic elements, starts one of the two counters, CNTR-1 312 or CNTR-2 314, at the time of a starting edge on one of the signals, Signal A or Signal B, and stops the same counter at the time of a stopping edge.

The time-interval to voltage converter 300 is capable of performing eight basic measurement types. The microprocessor 304 monitors the front panel user interface 302 and informs the edge selection and counter control logic 310 of the Measurement Type. Three bits of data specify which of the eight basic measurements is desired. The edge selection and counter control logic 310 produces the control signals for the counters 312 and 314 according to one of these eight measurement types and the behavior of the signals, Signal A and Signal B. Edge selection means determine on which edge of which signal the counter is to be started, and on which edge of which signal the counter is to be stopped. Counter control means start and stop one of the counters to make each measurement.

The eight basic measurement types are: (1) from the rising edge of one signal to the rising edge of the same signal (Period of A, rising edge selected), (2) the rising edge of one signal to the falling edge of the same signal (Width A, rising edge selected), (3) from the falling edge of one signal to the falling edge of the same signal (Period A, falling edge selected), (4) from the falling edge of one signal to the rising edge of the same signal (Width A, falling edge selected), (5) from the rising edge of one signal to the rising edge of the other signal (Delay, A rising to B rising), (6) from the rising edge of one signal to the falling edge of the other signal (Delay, A rising to B falling), (7) from the falling edge of one signal to the falling edge of the other signal (Delay, A falling to B falling), and (8) the falling edge of one signal to the rising edge of the other signal (Delay, A falling to B rising).

In order to analyze time intervals at the maximum possible rate while not missing any intervals of interest, the edge selection and counter control logic 310 suitably alternates between using Count-1 to make CNTR-1 312 count and Count-2 to make CNTR-2 314 count. This allows time for the counter not making the measurement to be read out and preloaded. In an alternative embodiment, only one counter may be used and additional circuitry added to keep track of the prior count value, so that the prior count value can be subtracted from the present count value to produce a difference value that is the same as the value obtained in the embodiment shown in FIG. 3.

The edge selection and counter control logic 310 also informs the microprocessor 304, via the Sample Missed signal, when events are occurring too fast for continuous sampling. In response to this information, the microprocessor 304 causes the Random Sampling indicator 35 to light up on the front panel 302. The edge selection and counter control logic 310 suitably controls the readout of the counters 312 and 314 with a simple state machine, e.g. based on a shift register, and monitors the incoming edges that terminate one measurement and start another. The edge selection and counter control logic has the information that it needs to generate the Sample Missed signal and skip a measurement.

The counters 312 and 314 receive preload information based on the offset value selected by the operator in the display area 10 seen in FIG. 1. The counters 312, 314 count a clock signal sent to them by timebase selection multiplexer 320 via gating circuitry in the edge selection and counter control logic 310 when they are to count. Control signals from the microprocessor 304 set the timebase selection multiplexer 320 to select either the high speed clock signals of the reference timebase 322 or one of six timebases derived from that reference timebase by cascaded divide-by-10 circuits 324–334. In one embodiment, the reference timebase 322 is a 30 MHz oscillator; the timebase selections available are therefore 30 MHz, 3.0 MHz, 0.3 MHz, 30 KHz, 3.0 KHz, 300 Hz, and 30 Hz. Having the timebase selections in decade steps is particularly convenient for compatibility with an oscilloscope, since changing the resolution one step on the time-interval to voltage converter corresponds to one times ten change in the fixed attenuators in the oscilloscope's vertical gain controls.

The microprocessor 304 receives offset inputs from the operator through the front panel 302, and from them calculates offset values that are scaled appropriately for the timebase presently selected. These values are then stored by offset values register 336 and supplied to both counters, CNTR-1 312 and CNTR-2 314, by the offset value register 336.

The outputs of the counters, CNTR-1 312 and CNTR-2 314, are Value-1 and Value-2, each 20 bits wide, and Overflow-1 and Overflow-2. The Overflow signals notify the microprocessor 304 when the counters 312 and 314 count through their terminal counts for a second time. The first time that they count through their terminal count they have only cancelled out the offset values they were preloaded with, but if they reach their terminal counts for a second time, the resolution setting needs to be changed.

The out-of-range detection logic 316 receives Value-1 or Value-2, depending on the state of the signal OUTPUT ½. The function of the out-of-range detection logic 316 is to inform the microprocessor, and ultimately the operator, when the number counted exceeds the capacity of the digital to analog converter 318.

Because oscilloscopes typically have eight centimeter high displays with nine horizontal graticule lines, the outputs that would go off the screen are suitably clipped to only go a little over four centimeters in each direction. The output voltage is then limited to these values by the capacity of 8-bit Digital-to-Analog Converter (DAC) 318. The 8-bit DAC 318 produces voltages proportional to the state of its inputs, which can assume values from −128 to +127. If the 20-bit Value-1 or Value-2 are out of the range of the 8-bit DAC 318, the out-of-range detector 316 generates either an Under-Range signal or an Over-Range signal.

These signals are used for two purposes. One purpose is to cause the output of the DAC 318 to either go to maximum or go to minimum, depending on whether the detected condition is Over-Range or Under-Range, respectively. The other purpose is to inform the microprocessor 304 of these conditions. The microprocessor 304 needs this information for one of two reasons, depending on whether or not the software routine associated with the Auto key is running. If the Auto routine is not running, the microprocessor 304 notifies the operator of Under-Range and Over-Range conditions by causing the Out of Range indicator 22 to light on the front panel user interface 302. If the Auto routine is running, it is monitoring the Over-Range and Under-Range conditions as part of its calculations of the most appropriate settings for resolution and offset to keep the signal's behavior out-of-range.

To make the operation of the time-interval to voltage converter of the present invention more clear, examples will be discussed. For instance, if the time interval of interest in a particular measurement is just under one millisecond, and varying between 920 and 990 microseconds, then suitable instrument settings for the time-interval to voltage converter 300 would be 10 microseconds per division with an offset of 950 microseconds. At these settings, 950 microseconds produces zero volts and is on the center graticule of the usual oscilloscope, with the longest signals producing voltages that almost reach the top graticule of the display and the shortest signals producing voltages that are minus three divisions on the oscilloscope.

The microprocessor 304 would then direct the timebase selection multiplexer to select the 3.0 MHz timebase produced by the first divide-by-10 circuit 324. Over 950 microseconds, the 3.0 MHz timebase will be counted 2850 times (333.3 ns per clock). The microprocessor 304 then supplies an offset value to the offset values register 336 that is in binary and is the two's complement of 2850. The next active counter 312 or 314, as determined by the edge selection and counter control logic 310, is preloaded with this number. Thus, the first 2850 clocks, occurring over the next 950 microseconds, cause the counter 312 or 314 to reach its full count and roll over to all zeroes. Let us assume that the next occurrence of the time interval being measured happens to be 980 microseconds. It took 950 microseconds for the counter to count to 2850 counting the 3.0 MHz timebase. It will then need to count 90 more times to time out the last 30 microseconds of the interval of interest and 90 will be the Value A or Value B forwarded to the out-of-range detection logic 316. And, since the range of the 8-bit DAC 318 is from −128 to +127, the value of 90 will not cause the out-of-range detection logic 316 to produce either an Under-Range or Over-Range indication. Because the full range of the 8-bit DAC 318 is 256 possible output levels over an 800 mv range (+/− 400 mv) and these are being used to cause a total deflection of slightly over eight and a half divisions of the oscilloscope screen, a count of +90 produces three divisions of deflection on the oscilloscope display (30 bits per division).

Let us now assume that the variability in the signal's behavior increases so that soon an interval of 995 microseconds is encountered. The offset and resolution settings are still 950 microseconds and 10 microseconds per division, respectively, so the preload value is still the two's complement of 2850 and the 3 MHz timebase 324 is still selected. The active counter, 312 or 314, again reaches its full count and rolls over to all zeroes after the first 2850 clocks from the 3 MHz timebase 324. Now, however, an additional 135 clocks are counted before the final 45 microseconds of the 995 microsecond interval expires. Since 135 exceeds the +127 range of the DAC 318, out-of-range detection logic produces an Over-Range signal. The Over-Range signal is communicated to the DAC 318 as an Output Maximum signal, causing it to produce its maximum output voltage. The active Over-Range signal is also monitored by the microprocessor 304 which, in response to it, causes the Out of Range indicator 22 to light on the front panel 302.

Let us assume that the operator now changes the resolution setting of the time-interval to voltage converter 300 by pressing the top Resolution per Division key 24 on the front panel 302, so that the resolution decreases to 100 microseconds per division. Now, instead of filling the oscilloscope screen and causing Out of Range indicator 22 to light, the whole signal will only occupy about one division of vertical space on the display. Moreover, internally, the offset preload value and selected timebase must be changed. Microprocessor 304 monitors operator inputs to the front panel user interface 302 and detects the operator's action. The microprocessor 304 changes the timebase selection signals to the timebase selection multiplexer 320 so that the 300 KHz output of the second divide-by-10 circuit 326 is selected as the signal to be counted by CNTR-1 312 and CNTR-2 314. The microprocessor 304 also sends a new value to the Offset Values register 336. The new value is the two's complement of 285, instead of the previous 2850. The microprocessor 304 also sends feedback to the operator in the form of lighting the "100 us" indicator adjacent to the Resolution per Division keys 24,26.

If the next interval to be measured is 920 microseconds long, 276 clock pulses from the 300 KHz timebase will occur while it is being measured. At the end of the measurement interval, a value of −9 is left in the active counter, 312 or 314. This is within the range of the DAC 318, so the Out-of-Range detection logic 316 does not generate any Under-Range or Over-Range signals. With the whole screen corresponding to a DAC 318 range of 256, there are 30 bits per division, so a −9 causes a negative deflection of slightly less than ⅓ of a division.

FIGS. 4.1 through 4.7 are a logic flow diagram of the operation of the software routine invoked by the Auto key. When the operator presses the Auto key 14, the operations in box 426 are performed. That is, a value for "max" is set to zero, a value for "min" is set all ones (full negative), a value for the latest trial resolution setting, "newres", is set to the maximum resolution of 1 microsec/div, this value is used as the resolution "res", and the offset is set to zero.

A routine "Wait for Measurement" 428 is then entered. This routine marks time until a new measurement arrives, until a key is pressed on the front panel 302, or until it times out after 50 milliseconds. If it times out 430-Yes, a NoTrig(ger) 432 indication causes (FIG. 4) the offset and resolution to be reset 582 to their status at the time that the Auto key 14 was pressed and a FAILURE to be returned to the main program.

If the "Wait for Measurement" routine did not time out, the "measure counter" is set to zero 434 and data is collected while the "measure counter" has counted less than 20 measurements and less than a second has passed, but more than 20 measurements can take place if they take less than 100 milliseconds 436. During this time, measurements are taken 440 and the "measure counter" is incremented with each measurement 438.

During the data collection process, Overflow-1 and Overflow-2 from the 20-bit counters 312 and 314 are monitored 446 by the microprocessor 304. If an Overflow signal is received, the microprocessor 304 decreases "newres" by one increment 448, resets the offset to zero, uses "newres" as the resolution and, if a measurement has occurred 452, the acquired values for "max" and "min" are divided by ten 454 to make them consistent with the "newres" value. Thus, by the time data collection is completed, a resolution has been found that puts the intervals being measured within the range of the counters CNTR-1 312 and CNTR-2 314, even though they may be producing numbers on their output that are outside of the range of DAC 318. The "Wait for Measurement" routine is entered again twice, the first time 456 to clear the interrupted measurement and the second time 468 via (A) to actually collect data at the new settings.

As data is collected 446-(B), a record is kept 452–482. of the shortest "min" and longest "max" intervals measured. At the end of the data collection 482-(C), the difference between the "max" and "min" values are compared 462 with the value "80", which is the range of the DAC 318 at the present setting as seen by the software. 80 is eight divisions at 10 increments each and each increment corresponds to the least significant bit of the offset value in the display area 10 of the front panel 302. Recalling that there are 30 DAC 318 output bits per division, each least significant bit in the offset value corresponds to three DAC output bits. Each time that the resolution settings are made coarser 464 by one factor of ten, the records "max" and "min" are also divided 464 by ten to keep them scaled to the new resolution setting.

After any necessary adjustments of the resolution 464, the "max" and "min" values are used to define 466 a "highlimit" and a "lowlimit". These limits will be used to try to close in on the best offset value, as will be further described below. The "lowlimit" is set 466 to MAX and the "highlimit" is set to MIN. MAX is zero if the maximum measured value "min" is less than half of the present DAC range; otherwise it is the maximum measured value "max" minus one half of the present range (40=80/2). MIN is the maximum available offset, MAXNULL, if the minimum measured value "min" plus half of the present DAC range is greater than the maximum available offset, while otherwise it is the measured minimum value "min" plus one half of the present range. This positions the offset so that neither extreme measured value will be clipped and so that the offset is within its available setting limits.

Step 466 also includes taking the average of the "min" and "max" values, "center", and "loopstat" is initialized either to LOOP-BUMP, if the value of "center" is greater than MAXNULL, or to LOOPTRYCENTER otherwise. Following (D) to 484, while "loopstat" is not equal to LOOPDONE, the software routine remains in one of the statuses: LOOPTRYCENTER, LOOPUNDER, LOOPOVER, LOOPBUMP, or LOOPNOTRIGGER.

Assuming that the loopstatus is LOOPTRYCENTER, following (E) to 504, a routine "testsettings" is selected. "Testsettings" returns one of the values NOTRIG 506, NEITHER 510, BOTH 514, UNDER 518, or OVER 522. Depending on which of these is returned by testsettings, "loopstatus" will be changed to LOOPNOTRIG, LOOPDONE, LOOPBUMP, LOOPUNDER, or LOOPOVER, respectively.

Following (I) to the "testsettings" routine, this routine is given three pieces of information: offset, resolution, and code. Offset, a variable local to this routine, tells it what value to use 588 as the hardware setting for the offset. Similarly, with resolution, it tells this routine how to set 588 the hardware's resolution setting. Code can have one of three values UNDER, OVER, or BOTH. BOTH tells this routine to continue making measurements until timeout or until both an Under-Range and an Over-Range signal are received. UNDER or OVER tells it to terminate taking measurements when only the indicated Out-of-Range signal is received.

If "Wait for Measurement" 590 times out 592-Yes, a "NOTRIG" is returned and the software routine shuts down as previously described. This "Wait for Measurement" 590 is similar to the one at 456 in FIG. 4.1 in that it serves the function of clearing hardware, rather than actually collecting data. For what follows in this routine, "testsettings", no actual times need to be read back from the counters CNTR-1 312 and CNTR-2 314, since monitoring the Under-Range and Over-Range signals will provide all the information that is needed.

After the hardware has been cleared, the overrange and underrange status bits are cleared 594 and a timer started. While this timer has counted less than 300 milliseconds 596, the counter status is monitored 612 for Under-Range and Over-Range signals. If an Under-Range indication is received, but not an Over-Range indication, and the code is UNDER, then an UNDER is returned via 614-No, 624-Yes, and 626. If the code is OVER, and an Over-Range indication is received, but not an Under-Range indication, then an OVER is returned via 614-Yes, 616-No, 620-Yes, and 622. If both Over-Range and Under-Range signals are received, then a BOTH is returned via 614-Yes, 616-Yes and 618. If one of the Out-of-Range signals is received, but not the other and the code is BOTH, then the 300 millisecond timer will time out 596.

After the 300 millisecond timer has timed out 596, the status of the overrange and underrange status bits is checked. The 300 milliseconds was selected to be somewhat longer that the interval between updates of the Out of Range indicator 22 on the front panel 302, which is about 250 milliseconds. Thus, if no Over-Range or Under-Range signals occur for this period of time, then it is very likely that, even if some Over-Range and Under-Range signals do occur from time to time in the future using this setting, the Out of Range indicator will at most flash intermittently and will not be on constantly.

If an Under-Range, but not an Over-Range, indication was received during this interval, then an UNDER is returned via 598-No, 608-Yes, and 606. Conversely, if an Over-Range, but not an Under-Range, indication is received, then an OVER is returned via 598-Yes, 600-No, and 604. If both indications were received on the very last counter status look, then a BOTH is returned via 598-Yes, 600-Yes, and 602. And, if neither indication is received, then a NEITHER is returned via 598-No, 608-No, and 610.

Returning now to FIG. 4.4, the last time that we were here the "loopstat" was LOOPTRYCENTER and we went to FIG. 4.7 via 488 and (I). Let us assume that "testsettings" returned an OVER, so that "loopstat" becomes LOOP OVER via 522 and 524. Looking again at FIG. 4.3, "loopstat" is still not LOOPDONE.

Referring now to FIG. 4.6, with "loopstat" LOOPOVER, the "lowlimit", the "newres" value, and a code of OVER are passed to "testsettings". Moving, via (I), to FIG. 4.7, let us assume that this time an Over-Range and an Under-Range indication is received before the timer times out 596, and a BOTH is returned via 614-Yes, 616-Yes, and 618.

Referring again to FIG. 4.6, the return of a BOTH causes "loopstat" to become LOOPBUMP. Then, looking at FIG. 4.3, LOOPBUMP sends the program to 578, and causes decreasing "newres" by one setting, doing the corresponding divisions of "min" and "max", calculating a "center" that is the average of "min" and "max" again, calculating the "highlimit" and "lowlimit" again, and changing the "loopstat" back to LOOPTRYCENTER.

Still within the while "loopstat" not equal LOOPDONE command, LOOPTRYCENTER now returns the program to (E). Referring then to FIG. 4.4, "testsettings" is invoked using "center", "newres", and BOTH. Then, following (I) to FIG. 4.7, more measurements are made with the new, coarser resolution setting.

Let us now assume that the next return from "testsettings" is an UNDER. Returning to FIG. 4.3, as a result of the return of an UNDER, "loopstat" becomes LOOPUNDER, so (F) takes the program from FIG. 4.3 to FIG. 4.5 and then on to (I) and FIG. 4.7, with "testsettings" receiving "center", "newres", and UNDER.

Next, let us assume that "testsettings" returns a NEITHER. Referring now to FIG. 4.5, a NEITHER 532 causes the difference between the "lowlimit" and the "highlimit" to be compared 534 to a "5". Recalling that the computer keeps track of screen location in increments that are three times as large as the DAC output increments, and that there are 30 DAC output increments per division, this "5" represents ⅙ of a division. This decision block is therefore looking to see if the limits are within ⅙ of a division of each other. If they are not 534-No, as we will assume for the sake of exhausting all cases, the activities of block 538 are performed, i.e., the "highlimit" is changed to the "center", a new "center" is calculated by averaging the (new) "highlimit" and the "lowlimit", and "loopstat" is set back to LOOPTRYCENTER.

If we make the other assumption, that the difference between the "lowlimit" and the "highlimit" is less than "5", then "center" is set to the "lowlimit" and "loopstat" becomes LOOPDONE, returning us to the while loop 484 in FIG. 4.3. Now "loopstat" equals LOOPDONE and we drop through to the final activities of block 500 and END 502 the Auto software routine. The final activities 500 are to set the offset to "center" and the resolution to "newres" and return OK to the main program.

Figure 5:
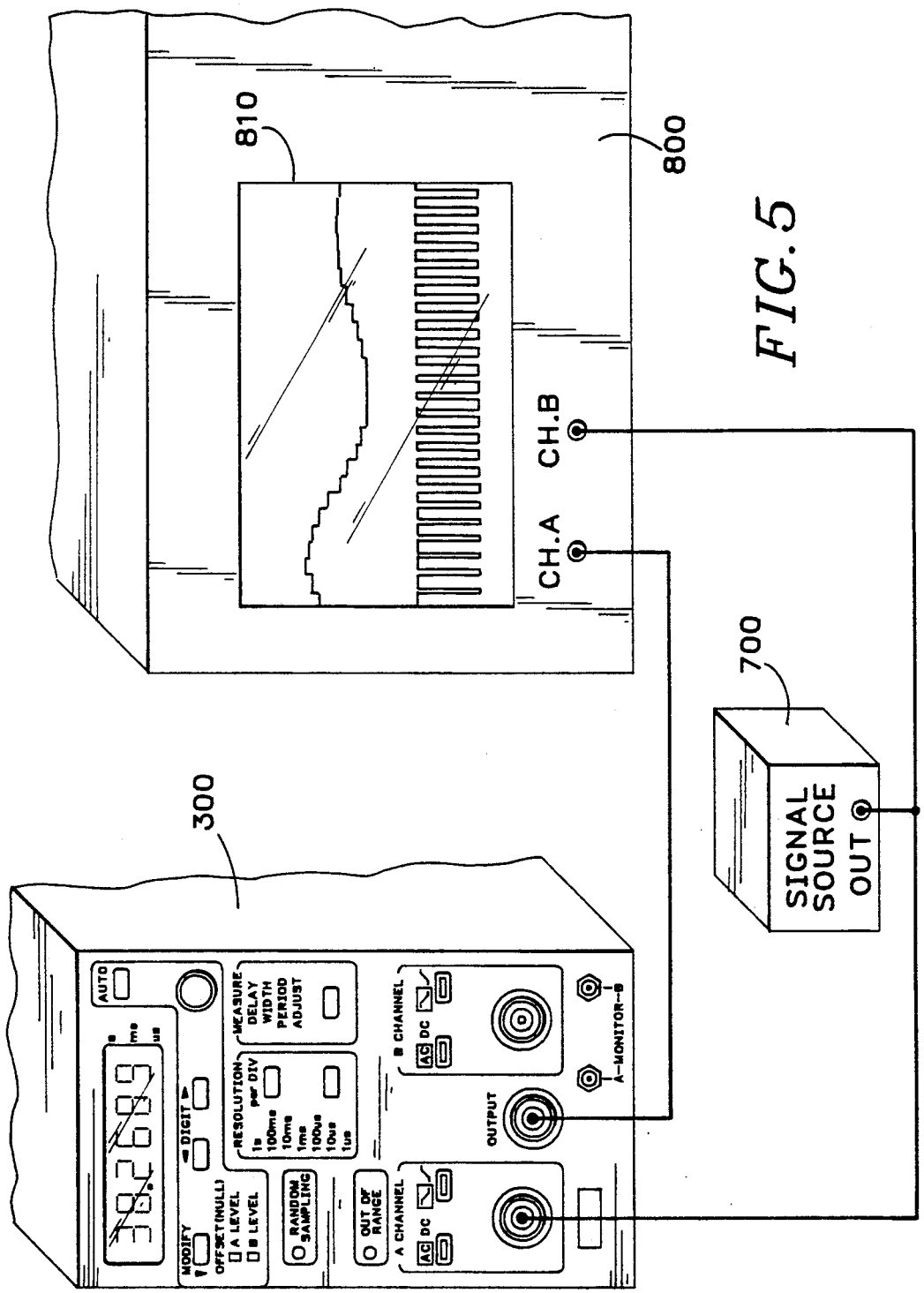
FIG. 5 is setup diagram showing the time-interval to voltage converter of the present invention in use with an oscilloscope and a signal source.

Referring now to FIG. 5, the output of a signal source 700 is shown applied to channel B of an oscilloscope 800 and channel A of the time-interval to voltage converter 300 of the present invention. The output of the time-interval to voltage converter 300 is being applied to Channel A of the oscilloscope 800. On the display 810 of the oscilloscope 800 the output of the time-interval to voltage converter, Channel A, is shown at the top of the screen, while the signal source is shown at the bottom. In this instance, the present invention provides a continuous, real-time display of the time-interval behavior of a signal displayed contemporaneously with said signal.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true spirit and scope of the invention.

I claim:

1. A method for analyzing time-interval information in electrical signals, comprising the steps of:
   selecting the type of time-interval to be measured;
   scaling a clock signal appropriately;
   offsetting a counting means as desired;
   counting the number of clock signals that occur during every selected time-interval to produce a counted result;
   limiting the counted result to a preselected range; and
   converting the counted result to an analog voltage.

2. A method as recited in claim 1 wherein the limiting step comprises the step of notifying an operator when the counted result has been limited.

3. A method as recited in claim 1 further comprising the step of detecting when time-intervals are occurring faster than they can be counted.

4. A method as recited in claim 3 wherein the detecting step comprises the step of notifying the operator that time-intervals have occurred faster than they could be counted.

5. A method as recited in claim 1 wherein the scaling step comprises the steps of:
   generating a timebase;
   dividing the timebase to produce a plurality of timebases at different frequencies; and
   selecting one of the plurality of timebases as the clock signal.

6. A method as recited in claim 5 wherein the selecting one of the plurality of timebases step comprises the step of translating operator input into timebase selection control signals.

7. A method as recited in claim 1 wherein the offsetting step comprises the step of preloading the counting means with an offset value.

8. A method as recited in claim 1 wherein the offsetting step occurs after the counting step and the offsetting step comprises the step of subtracting an offset value from an initially counted result to produce the counted result.

9. A method as recited in claim 1 further comprising the preliminary step of determining a time to voltage conversion ratio.

10. A method as recited in claim 9 wherein the determining step comprises the step of receiving an operator input.

11. A method as recited in claim 1 wherein the selections available in the selecting step comprise one or more of the following:
   rising edge of a first signal to rising edge of a first signal,
   rising edge of a first signal to falling edge of a first signal,
   falling edge of a first signal to falling edge of a first signal,
   falling edge of a first signal to rising edge of a first signal,
   rising edge of a first signal to rising edge of a second signal,
   rising edge of a first signal to falling edge of a second signal,
   falling edge of a first signal to falling edge of a second signal, and falling edge of a first signal to rising edge of a second signal.

12. An apparatus for analyzing time-interval information in electrical signals, comprising:
 means for selecting the type of time-interval to be measured;
 means for scaling a clock signal appropriately;
 means for counting;
 means for offsetting the counting means as desired;
 means for counting the number of clock signals that occur during every selected time-interval to produce a counted result;
 means for limiting the counted result to a preselected range; and
 means for converting the counted result to an analog voltage.

13. An apparatus as recited in claim 12 wherein the limiting means comprises means for notifying an operator when the counted result has been limited.

14. An apparatus as recited in claim 12 further comprising means for detecting when time-intervals are occurring faster than they can be counted.

15. An apparatus as recited in claim 14 wherein the detecting means comprises means for notifying the operator that time-intervals have occurred faster than they could be counted.

16. An apparatus as recited in claim 12 wherein the scaling means comprises:
 means for generating a timebase;
 means for dividing the timebase to produce a plurality of timebases at different frequencies; and
 means for selecting one of the plurality of timebases as the clock signal.

17. An apparatus as recited in claim 16 wherein the means for selecting one of the plurality of timebases comprises means for translating operator input into timebase selection control signals.

18. An apparatus as recited in claim 12 wherein the offsetting means comprises means for preloading the counting means with an offset value.

19. An apparatus as recited in claim 12 wherein the offsetting means is coupled to receive the output of the counting means and the offsetting means comprises means for subtracting an offset value from an initially counted result to produce the counted result.

20. An apparatus as recited in claim 12 further comprising means for determining a time to voltage conversion ratio.

21. An apparatus as recited in claim 20 wherein the determining means comprises means for receiving an operator input.

22. An apparatus as recited in claim 12 wherein the selections provided by the selecting means comprise one or more of the following:
 rising edge of a first signal to rising edge of a first signal,
 rising edge of a first signal to falling edge of a first signal,
 falling edge of a first signal to falling edge of a first signal,
 falling edge of a first signal to rising edge of a first signal,
 rising edge of a first signal to rising edge of a second signal,
 rising edge of a first signal to falling edge of a second signal,
 falling edge of a first signal to falling edge of a second signal, and
 falling edge of a first signal to rising edge of a second signal.

23. A method for calibrating the vertical gain and vertical offset of an oscilloscope to the output of a time-interval to voltage converter comprising the steps of:
 sequentially generating an odd-numbered plurality of equally spaced apart voltage levels, all of which are generated for substantially equal periods of time except that a voltage level at the average of all of the voltage levels is generated for a substantially longer period of time than the other voltage levels;
 repeatedly applying the sequentially generated odd-numbered plurality of equally spaced apart voltage levels to a vertical input of the oscilloscope; and
 adjusting the vertical gain and vertical offset controls of the oscilloscope until the voltage level at the average of all of the voltage levels is aligned with a center horizontal graticule of the oscilloscope, a lowest voltage level is aligned with a bottom horizontal graticule of the oscilloscope, and a highest voltage level is aligned with a top horizontal graticule of the oscilloscope.

24. A method as recited in 23 wherein the repeatedly applying step comprises the step of letting a trigger circuit of the oscilloscope free-run.

25. A method for automatically finding proper resolution and offset settings in a time-interval to voltage converter comprising the steps of:
 initializing an offset setting to zero;
 initializing a resolution setting to maximum;
 gathering data, saving minimum values and maximum values, while monitoring an overflow signal;
 changing the resolution setting in the direction of less resolution in response to an occurrence of the overflow signal;
 changing the resolution setting in the direction of less resolution in response to the difference between minimum values and maximum values being greater than a present range of the converter;
 guessing an offset setting based on the saved minimum values and maximum values data; and
 testing the guessed offset setting by gathering more data.

26. A method as recited in claim 25 further comprising the step of improving the guessed offset setting.

27. A method as recited in claim 26 wherein the improving step comprises the steps of:
 finding lower and upper limits for the offset setting;
 changing the guessed offset setting within the lower and upper limits;
 testing the changed guessed offset limits by gathering data and monitoring over-range and under-range signals to produce test results; and
 using the test results to improve the guessed offset setting and to change the upper or lower limit to make the upper and lower limit closer together.

28. A method as recited in claim 27 further comprising the step of repeating the steps of changing, testing and using until the upper and lower limits are closer together than a predetermined percentage of a maximum output voltage range of the converter.

* * * * *